United States Patent
McCall

(10) Patent No.: US 8,101,850 B2
(45) Date of Patent: Jan. 24, 2012

(54) ASYMMETRIC PARABOLIC COMPOUND CONCENTRATOR WITH PHOTOVOLTAIC CELLS

(75) Inventor: Joe McCall, Sandy Springs, GA (US)

(73) Assignee: MIP, LLC, Sandy Springs, GA (US)

( * ) Notice: Subject to any disclaimer, the term of this patent is extended or adjusted under 35 U.S.C. 154(b) by 0 days.

(21) Appl. No.: 12/732,040

(22) Filed: Mar. 25, 2010

(65) Prior Publication Data

US 2011/0094564 A1    Apr. 28, 2011

(30) Foreign Application Priority Data

Oct. 26, 2009 (AU) .................................. 2009230775

(51) Int. Cl.
*H01L 31/0232* (2006.01)
(52) U.S. Cl. ........... 136/246; 136/244; 136/259; 438/65
(58) Field of Classification Search .................. 136/246; 438/57
See application file for complete search history.

(56) References Cited

U.S. PATENT DOCUMENTS

| | | | |
|---|---|---|---|
| 5,118,361 A | 6/1992 | Fraas et al. | |
| 5,772,791 A * | 6/1998 | Laing | 136/246 |
| 2005/0022858 A1 | 2/2005 | Terao et al. | |
| 2005/0103376 A1 * | 5/2005 | Matsushita et al. | 136/251 |
| 2006/0072222 A1 * | 4/2006 | Lichy | 359/853 |
| 2006/0260605 A1 | 11/2006 | Connor | |
| 2008/0087761 A1 * | 4/2008 | Jenkins et al. | 244/3.16 |
| 2008/0210292 A1 * | 9/2008 | Urli | 136/246 |
| 2008/0223443 A1 | 9/2008 | Benitez et al. | |

FOREIGN PATENT DOCUMENTS

WO    WO 2009-091827 A2    7/2009

OTHER PUBLICATIONS

Ronnelid et al., Optical Acceptance Function of Modified Compound Parabolic Concentrators with Linear Corrugated Reflectors, Applied Optics, vol. 37, Nol. 22, pp. 5222-5226, 1998.*
International Application No. PCT/US2010/034599, International Search Report and Written Opinion, 9 pages, Jul. 15, 2010.

* cited by examiner

*Primary Examiner* — Jennifer Michener
*Assistant Examiner* — Jayne Mershon
(74) *Attorney, Agent, or Firm* — Kilpatrick Townsend & Stockton LLP

(57) ABSTRACT

An asymmetric compound parabolic concentrator (ACPC) coupled with a photovoltaic cell is disclosed according to some embodiments. The disclosed ACPC can concentrate solar light from a large full acceptance angle toward the photovoltaic cell. In some embodiments, the ACPC can be submerged within a liquid (e.g., water). The liquid can increase the full acceptance angle, provide temperature damping, and provide structural inertia to the system. In some embodiments, the ACPC can be constructed from acrylic or other resins.

17 Claims, 9 Drawing Sheets

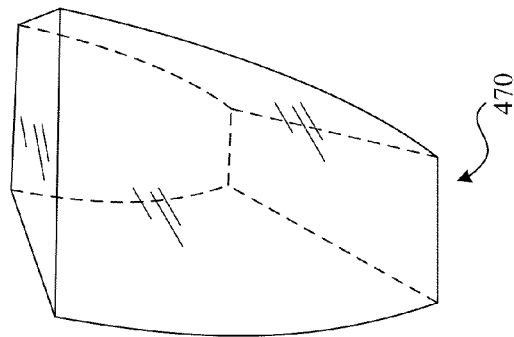
FIG. 4C
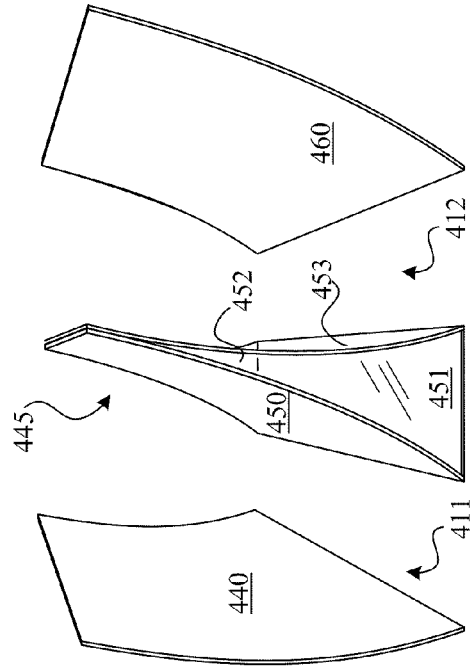
FIG. 4B
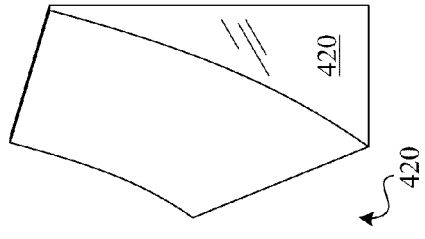
FIG. 4A
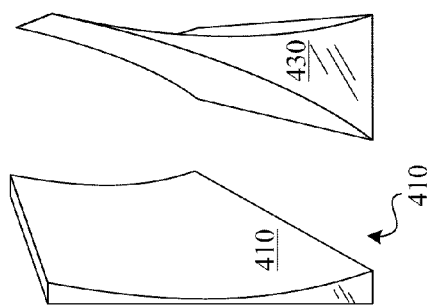

ASYMMETRIC PARABOLIC COMPOUND CONCENTRATOR WITH PHOTOVOLTAIC CELLS

BACKGROUND

There is considerable interest in the development of renewable energy sources to replace petroleum-based fuels. The collection of solar energy is an abundant renewable energy source. Currently only a very small percentage of the energy received from the sun is used by man. A number of systems are available that convert solar energy into electricity. These systems range from small generators to large electricity producing arrays.

Typical photovoltaic cells used in current solar systems are inefficient. Even with concentrated light and a cooled photovoltaic cell, efficiencies are hoped to break 50% in the future. Practically speaking the efficiency of such systems are much lower. Moreover, the cost per kilowatt hour is much higher than the cost of a kilowatt hour from conventional energy production systems.

BRIEF SUMMARY

Embodiments of the invention include an asymmetric compound parabolic concentrator (ACPC) coupled with a photovoltaic cell (ACPC-PV). In some embodiments, the ACPC can have a full acceptance angle of about 60° or more. In some embodiments, the acceptance angle can be greater than about 60°. In some embodiments, portions or the entire ACPC can be submerged in a liquid such as water. The liquid can effectively increase the full acceptance angle, provide environmental protection to the ACPC and/or the photovoltaic cells, and/or provide thermal stability. In some embodiments, the presence of the water can increase the acceptance angle of an ACPC. In some embodiments, the reflective sides of the ACPC can have dissimilar shapes. In some embodiments, the ACPC can be constructed from acrylic or other plastic resins. In some embodiments, the ACPC reflective surfaces can have a shape that includes either or both of parabolic and straight portions.

BRIEF DESCRIPTION OF THE DRAWINGS

FIGS. 4A and 4B show asymmetric compound parabolic concentrators aligned side-by-side according to some embodiments of the invention.

FIG. 4C shows a solid acrylic asymmetric compound parabolic concentrators according to some embodiments of the invention.

DETAILED DESCRIPTION

In some embodiments of the invention, an asymmetric compound parabolic concentrator (ACPC) is disclosed that may collect light and direct the light onto a photovoltaic cell. The combined device is an ACPC with a photovoltaic cell (ACPC-PV). The ACPC can collect light from the sun without the use of tracking devices despite seasonal variations in the sun's elevation. In some embodiments, an ACPC can be submerged in an liquid (e.g., water or some water solution) and/or coupled with a photovoltaic cell. In some embodiments, the liquid can be a combination of water with other substances such as glycerol or alcohols. When choosing a liquid, in some embodiments, the liquid can have a high specific heat for increased heat stabilization, a lower solar absorption to allow more solar light to pass through the liquid, and/or a high viscosity to reduce rippling at the surface.

Figure 1:
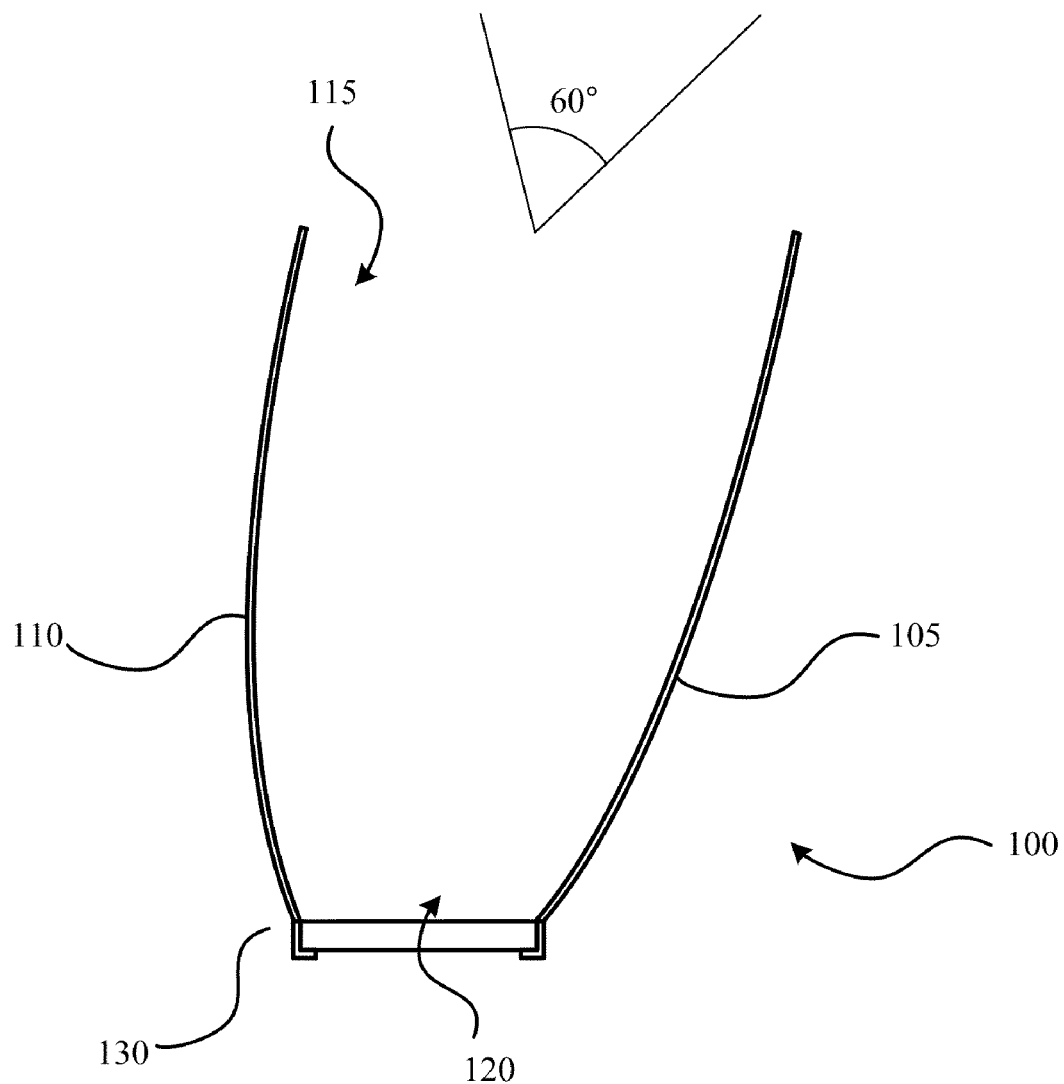
FIG. 1 shows an asymmetric compound parabolic concentrator according to some embodiments of the invention.

FIG. 1 shows ACPC 100 coupled with a photovoltaic cell 130 according to one embodiment of the invention. Photovoltaic cell 130 can include any number of photovoltaic cells coupled together in series. ACPC 100, can be comprised of any type of reflective material. In some embodiments, ACPC 100 can be constructed from an acrylic material. In some embodiments, the parabolic surfaces that make up the ACPC can have different shapes—hence the asymmetry. ACPC 100 may also include an entrance aperture (or entrance window) 115 and an exit aperture (or exit window) 120. ACPC 100 may collect light through entrance window 115 and reflect the light through to the exit aperture 120. The photovoltaic cell 130 can be positioned to collect light collected by ACPC 100 and directed through exit aperture 120.

The parabolic curves shaping the light reflective surfaces 105, 110 may be mathematically, geometrically, or visually different. That is the first reflective surface 105 may have a shape defined by one parabolic curve while the second reflective surface 110 may have a shape defined by a different parabolic curve or a different portion of the same parabolic curve. In some embodiments, the shape of the two light reflective surfaces 105, 110 may also include substantially linear portions. Thus, while the surfaces are described as parabolic surfaces, in some embodiments, these surface can include linear portions as well. In some embodiments, first reflective surface 105 includes a linear portion near exit aperture 120 and a parabolic portion near entrance aperture 115. Second reflective surface 110 includes a linear portion near exit aperture 120 and a parabolic portion near entrance aperture 115. Moreover, reflective surface 105 may also include a top straight edge and a bottom straight edge, and reflective surface 110 may include a top straight edge and bottom straight edge.

The size, dimensions, and/or angles shown in FIG. 1 are examples only. In the embodiment shown in FIG. 1 solar light enters the collector at the entrance aperture over a large acceptance angle. In this disclosure the term "full acceptance angle" refers to the angular aperture of an ACPC. The term "acceptance angle" refers to the half angular aperture of an ACPC. In some embodiments, the full acceptance angle is not symmetric about an axis of the ACPC. In some embodiments, the acceptance angle can be around ±30° range. In other embodiments light may be collected over other ranges, for example, ±20°, ±25°, ±35°, ±40°, or ±45°. In some embodiments, the entrance aperture range can differ around a central axis. For example, while the combined acceptance angle for an ACPC may be around 60°, one parabolic surface may have a greater or lesser acceptance angle compared with the other parabolic surface. For example, reflective surface 105 may have an acceptance angle of 46° and reflective surface 110 may have an acceptance angle of 14° measured from the ACPC vertical axis. Various other angles may be used.

In some embodiments, ACPC 100 may also be configured with a 40° tilt from the vertical. Various other tilts may be used, for example, 5°, 10°, 15°, 20°, 25°, 30°, 35°, 45°, 50°, 55°, 60°, 65°, 70°, 80°, 85°, or 90°. In some embodiments, first reflective surface 105 abuts with exit aperture 120 at around 75°. In some embodiments, second reflective surface 110 abuts with exit aperture 120 at around 60°. In other embodiments, the two reflective surfaces can abut the exit aperture at a variety of angles.

In some embodiments, ACPC 100 shown in FIG. 1 can be horizontally or vertically mounted. As such, an ACPC may be aligned, for example, on flat surfaces, on the side of a building, or on a pitched roof. The parabolic surfaces 105 and 110 may have any parabolic and/or conic shape. For example, as the ACPC is tilted from horizontal to nearly vertical, the parabolic (conic) sections may change depending on the angle of the ACPC. In some embodiments, changes in the parabolic surfaces may be required in order to maintain high concentrator efficiencies. Moreover, variations in the parabolic surfaces can be implemented depending on the latitude and/or position of the ACPC.

An ACPC may collect light from the sun without using mechanical and/or actuating tracking devices and still capture a high percentage of sun light as the sun moves through its celestial path with the sun's daily and seasonal variations. In some embodiments, an ACPC may be coupled directly with a light-receiving device. For example, an ACPC may be immovably coupled directly with a solar cell array without requiring the ACPC to rotate or twist to capture more sun light as the sun's path changes. Instead, an ACPC may deliver solar light with at least about 80%, 85%, 90% or 95% efficiency, while maintaining a fixed position relative to any light-receiving device. In some embodiments, an ACPC may provide light at the exit aperture that is substantially perpendicular to the surface of the aperture. Light incident at the exit aperture at such a steep angle undergoes very little reflection allowing more light to exit the exit aperture.

Figure 2:
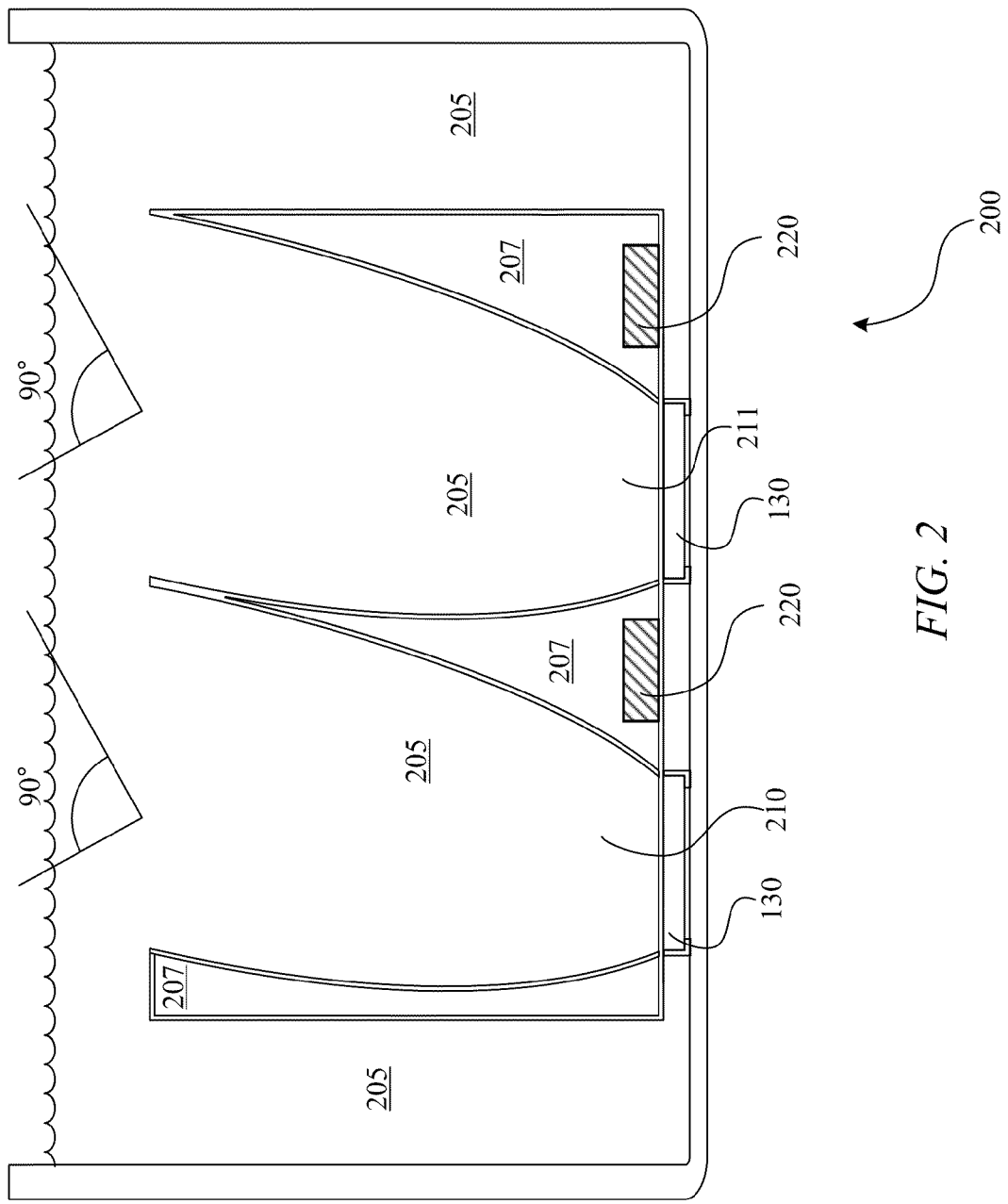
FIG. 2 shows an asymmetric compound parabolic concentrator coupled with a photovoltaic cell and submerged in a liquid according to some embodiments of the invention.

In some embodiments, as shown in FIG. 2, two conjoined ACPCs, 210, 211 can be submerged completely or partially within liquid 205. In some embodiments, the liquid level can be about an inch above the entrance aperture of the ACPCs 210, 211. In other embodiments, an ACPC can be submerged in a liquid with an index of refraction greater than about 1.0. In some embodiments, the parabolic surfaces of the ACPCs 210, 211 can be constructed from sheets of clear material, for example, acrylic, Plexiglas, or plastics. The sheets of clear material can be constructed with sealed air gaps 207. These air gaps 207 can create an interface that promotes total internal reflection of light incident at the interface between the clear sheets and the air. The air gaps, in some embodiments, can provide buoyancy to the parabolic surface structures such that weights 220 can be used to keep the parabolic structures from floating. Other mechanical devices such as bolts or tie-downs can also be used. While two ACPCs are shown in FIG. 2, any number ACPCs can be used.

Total internal reflection occurs at a surface boundary when a ray of light strikes the surface at an angle larger than a particular critical angle with respect to the normal to the surface. If the refractive index is lower on the other side of the boundary, no light can pass through and all of the light is reflected. For example, the index of refraction of air is approximately 1.0 and the index of refraction of acrylic is approximately 1.49, resulting in a critical angle of 42°. At angles greater than the critical angle light will be totally reflected. Thus, light incident on an acrylic sheet with an air interface beyond the acrylic will undergo total internal reflectance at angles greater than 42°. ACPCs can be constructed using materials that leverage the effects of total internal reflectance. In some embodiments, ACPCs can include troughs that include parabolic surfaces with an acrylic and air interface such as a solid acrylic trough or a trough constructed with parabolic shaped sheets of acrylic (e.g., FIG. 4B).

In some embodiments, the liquid can provide temperature moderation. Liquids, such as water, typically have a high specific heat. That is, liquids often require a large amount of energy to raise the temperature of the liquid. Thus, during the heat of the day, the temperature of the liquid will not increase as quickly as the ambient environment. Moreover, at night the liquid 205 can cool, which can then provide temperature regulation. In some embodiments, the liquid can be coupled with a pool of liquid or a heat exchanger through any number of pumps, pipes, and/or valves. In some embodiments a heat exchange can be used to cool the liquid during operation or even during night time. In some embodiments, a heat exchange can use pipes and/or tanks that are exposed to ambient or cool air. The liquid within these pipes and/or tanks can be cooled through the ambient or cool air. In some embodiments, a cooling tower like device can be used.

In some embodiments, the presence of the water can provide an ACPC with greater acceptance angles. For example, water has an index of refraction of about 1.3 and air has an index of refraction of about 1.0. Thus, according to Snell's Law, when light is incident on water at the interface between air and water, the light will bend into the water. Thus, light at a high angle of incidence (as measured from the normal) will enter the water at an effective angle that is less than the incident angle. Thus, liquids with high indexes of refraction allows light to effectively lower their incident angle and provide a higher effective full acceptance angle or acceptance angle. In some embodiments, the full acceptance angle can be about 70°, 80°, 85°, 90°, 95°, 100°, 105°, 110°, etc., in the presence of a liquid such as water.

In some embodiments, the presence of the water can also create a reflective surface at the interface of the parabolic surfaces and the water. For example, if the parabolic surfaces are made of acrylic (or any other plastic) then the presence of water within ACPC 100 can decrease the critical angle allowing for more light to undergo nearly complete total internal reflectance at smaller incident angles.

In some embodiments, ACPC 100 can be coupled with photovoltaic cell 130. Photovoltaic cell 130 can include any type of device that converts light into electrical charge. Photovoltaic cell 130 can be positioned beneath exit aperture 120. If ACPC 100 is submerged in a liquid, photovoltaic cell 130 can be sealed (e.g., hermetically sealed) in order to prevent any short circuiting through the liquid medium. Moreover, wires, connections, connectors, circuits, etc. associated with the photovoltaic cell 130, can also be hermetically sealed. In some embodiments, photovoltaic cell 130 can be positioned beneath ACPC 100 and in a chamber that does not include liquid 205. Photovoltaic cells 130 can be sealed within a partially transparent apparatus in order to allow light to transmit from ACPC 100 and be incident on photovoltaic cell 130. In some embodiments, photovoltaic cell 130 can include multiple off the shelf or specially made photovoltaic cells electrically coupled in series. In some embodiments, tab wires 320 of photovoltaic cell 130 can be aligned in parallel with an elongated axis of ACPC 100.

In some embodiments, liquid 205 can be purified using chemical or natural methods. For example, chemicals such as chlorine and/or salts can be used to keep liquid 205 clear. In other embodiments, natural methods such as the use of plants or other bio material to keep liquid 205 clean. In some embodiments, various pumps and filters can be included to clean and/or purify the liquid. In some embodiments, liquid 205 can also act as a heat sink for photovoltaic cell 130. For example, liquids such as water can have a high heat capacity and therefore require a large amount of energy to increase the temperature of the liquid. In some embodiments, photovoltaic cells 130 can operate more efficiently at lower temperatures. In such systems, the lower temperatures can allow the system to produce more electricity for the same quantity of light as a system at a higher temperature.

In some embodiments, water can provide mass to an ACPC that can, for example, protect the apparatus from damage in a wind storm. Moreover, water can dampen the affects of other weather related incidences such as heavy rain, hail, snow and high winds. Furthermore, the water can collect dust or other pollutants that would otherwise interfere with the photovoltaic cell and/or the reflective surfaces. Once collected within the water, the water can be filtered and/or purified to remove the foreign objects.

Figure 3:
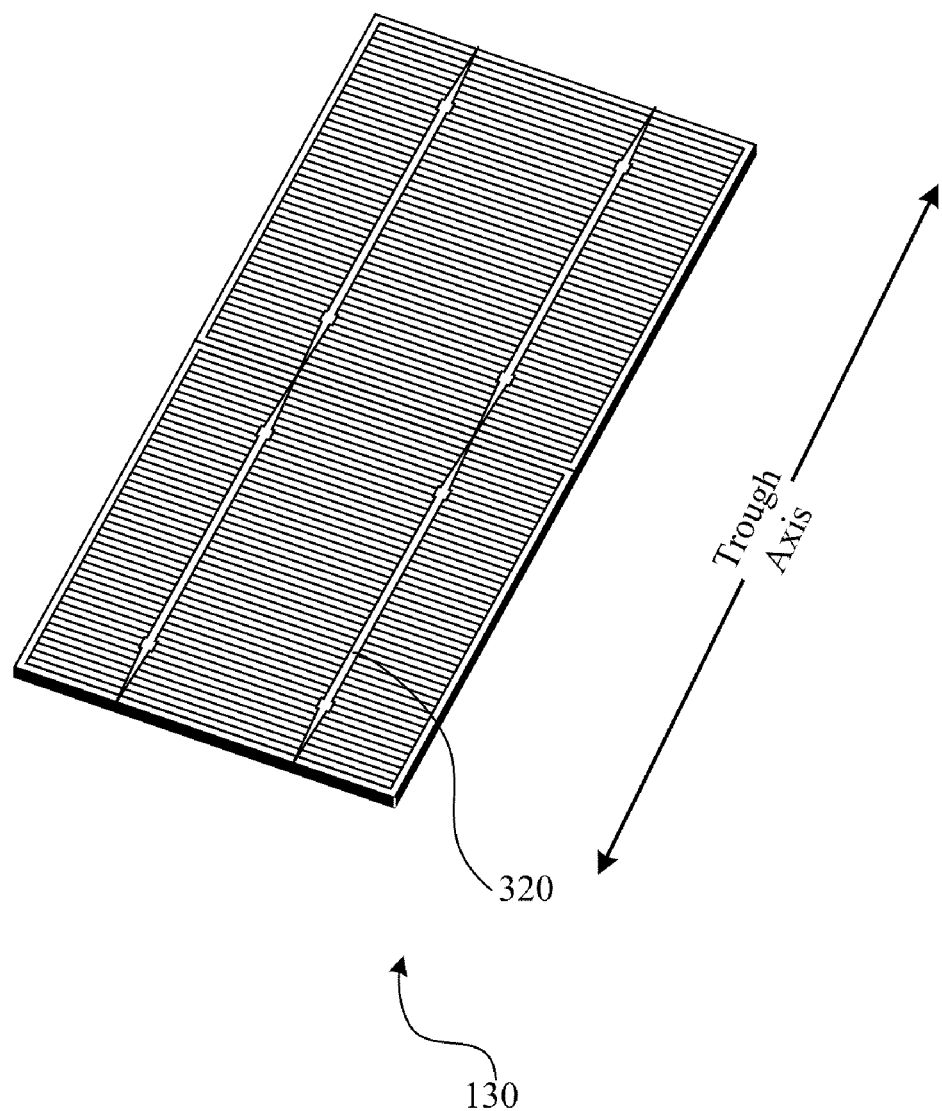
FIG. 3 shows photovoltaic cells coupled in series and aligned along the trough axis of an asymmetric compound parabolic concentrator according to some embodiments of the invention.

FIG. 3 shows two photovoltaic cells coupled together to form a group of photovoltaic cells 130. These photovoltaic cells can be positioned within exit aperture 120 of ACPC 100. Any number of photovoltaic cells can be coupled together to form a group of photovoltaic cells 130. Individual photovoltaic cells can be electrically coupled in series. In some embodiments, tab lines 320 can be coupled with tab lines from a neighboring photovoltaic cell. In some embodiments, tab lines 320 can be oriented parallel with the trough axis. Any number of individual photovoltaic cells can be used within a group of photovoltaic cells 130.

Photovoltaic cells can comprise any type of solar cell. Photovoltaic cells can include thin film solar cells, multiple junction solar cells, off the shelf solar cells, and/or application specific solar cells. In some embodiments, photovoltaic cells can include poly or monocrystalline silicon, cadamine-telluride, copper-indium selenide, gallium arsenide, light absorbing dyes, organic material, polymers, and/or nanocrystalline solar cells. Moreover, the solar cells can include one-sun solar cells or concentrator cells.

Figure 6:
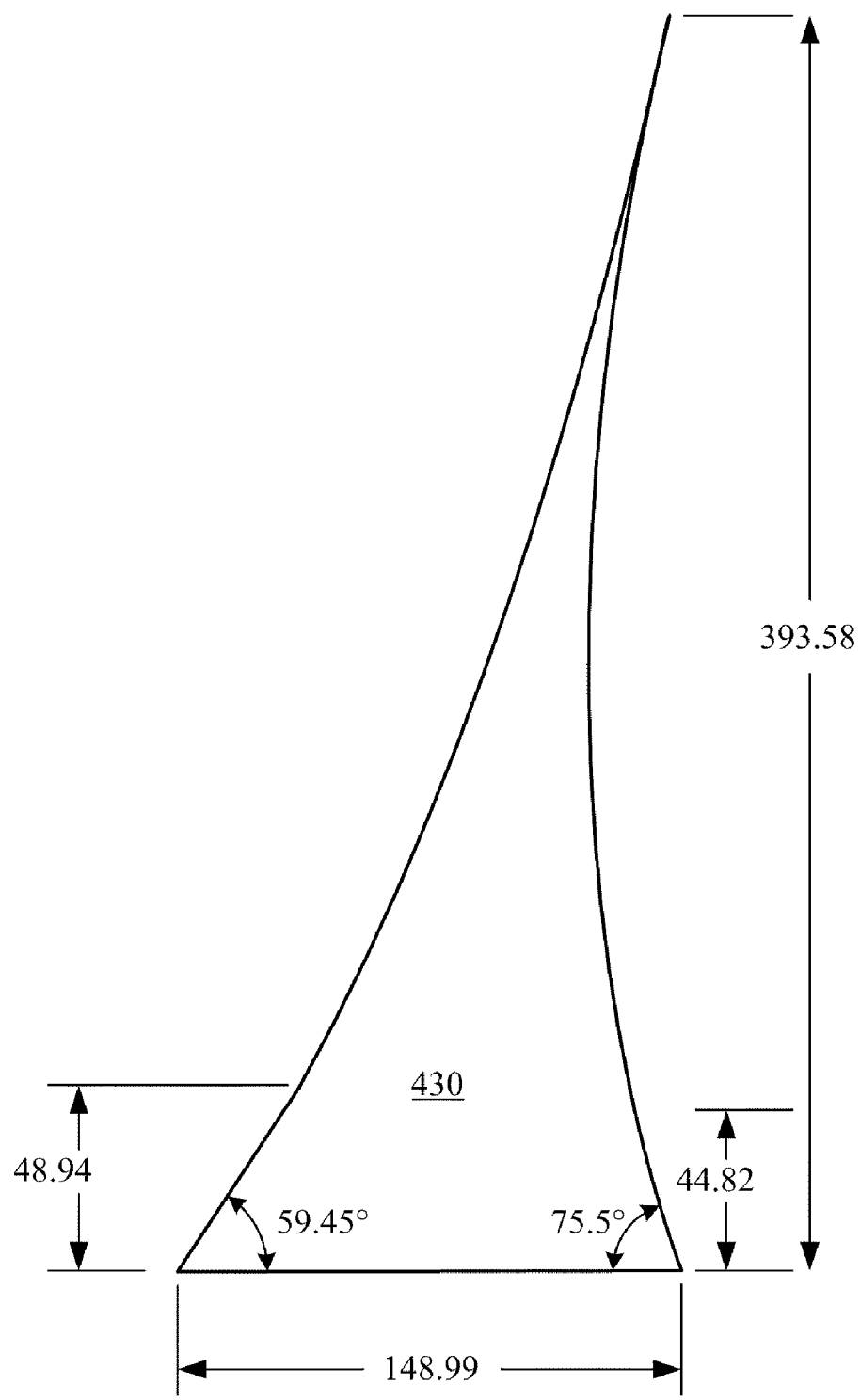
FIG. 6 is a side view of a block that includes two different parabolic surfaces according to some embodiments of the invention.
Figures 7A, 7B:
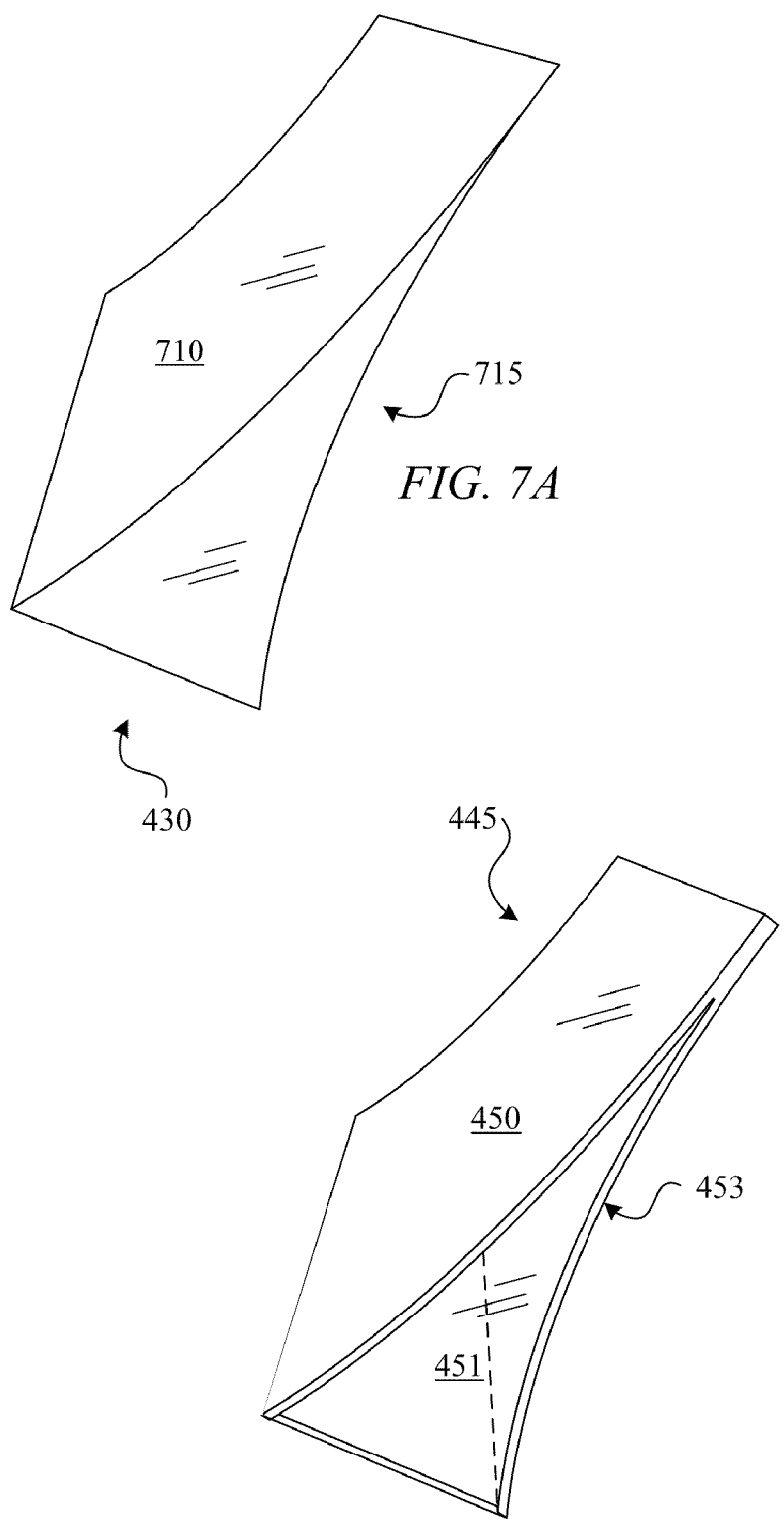
FIGS. 7A and 7B are three dimensional views of a block and sheets with two parabolic surfaces according to some embodiments of the invention.

FIG. 4A shows a three dimensional view of a pair of ACPCs 410, 420 coupled together. The ACPCs 410, 420 are constructed from a solid block of reflective material or any type of material and coated with a reflective material. Each ACPC 410, 420 are defined by the reflective parabolic surfaces. In some embodiments, some of the parabolic surfaces can be constructed from a block of material. In some embodiments, the block can be a block of acrylic material. FIG. 6 shows a side view of block 430 with examples of angular dimensions. FIG. 7A shows a three dimensional view of block 430. In some embodiments, surfaces 710 and 715 can be coated with a reflective substance. Outer parabolic surfaces 440, 450 can also be constructed of acrylic and can similarly be constructed from a single block of material.

FIG. 4B shows a three dimensional view of another pair of ACPCs 411, 412 coupled together. The ACPCs 411, 412 are constructed from sheets of reflective or clear material. Each ACPC 411, 412 is defined by the reflective parabolic surfaces 440, 450, 453, and 460. In some embodiments, some of the parabolic surfaces can be constructed from sheets of acrylic or other plastic material with an index of refraction greater than ambient air and greater than water or another liquid within which the ACPC is submerged. FIG. 7B shows a three dimensional view of block constructed of sheets defining the center two parabolic surfaces creating a closed air tight box 445. The box includes four surfaces 450, 451, 452 and 453, each of which can be constructed from a sheet of material (e.g., a sheet of acrylic or plastic). The sheets, for example, can have a thickness of 2", 1.5", 1", 0.5" 0.25", 0.125", etc. Outer parabolic surfaces 440, 460 can also be constructed of acrylic and define an air tight box.

FIG. 4C shows solid ACPC 470 according to some embodiments. Solid ACPC 470 can be constructed of acrylic or any other clear material. When placed within an environment having a lower index of refraction, light incident on any interface between the solid ACPC and the lower refractive index environment, will undergo total internal reflectance at angles greater than the critical angle.

In some embodiments, an ACPC can be constructed from acrylic material. In other embodiments, the ACPC can be constructed using any material that has an index of refraction greater than the liquid within which it is submerged.

Figure 5:
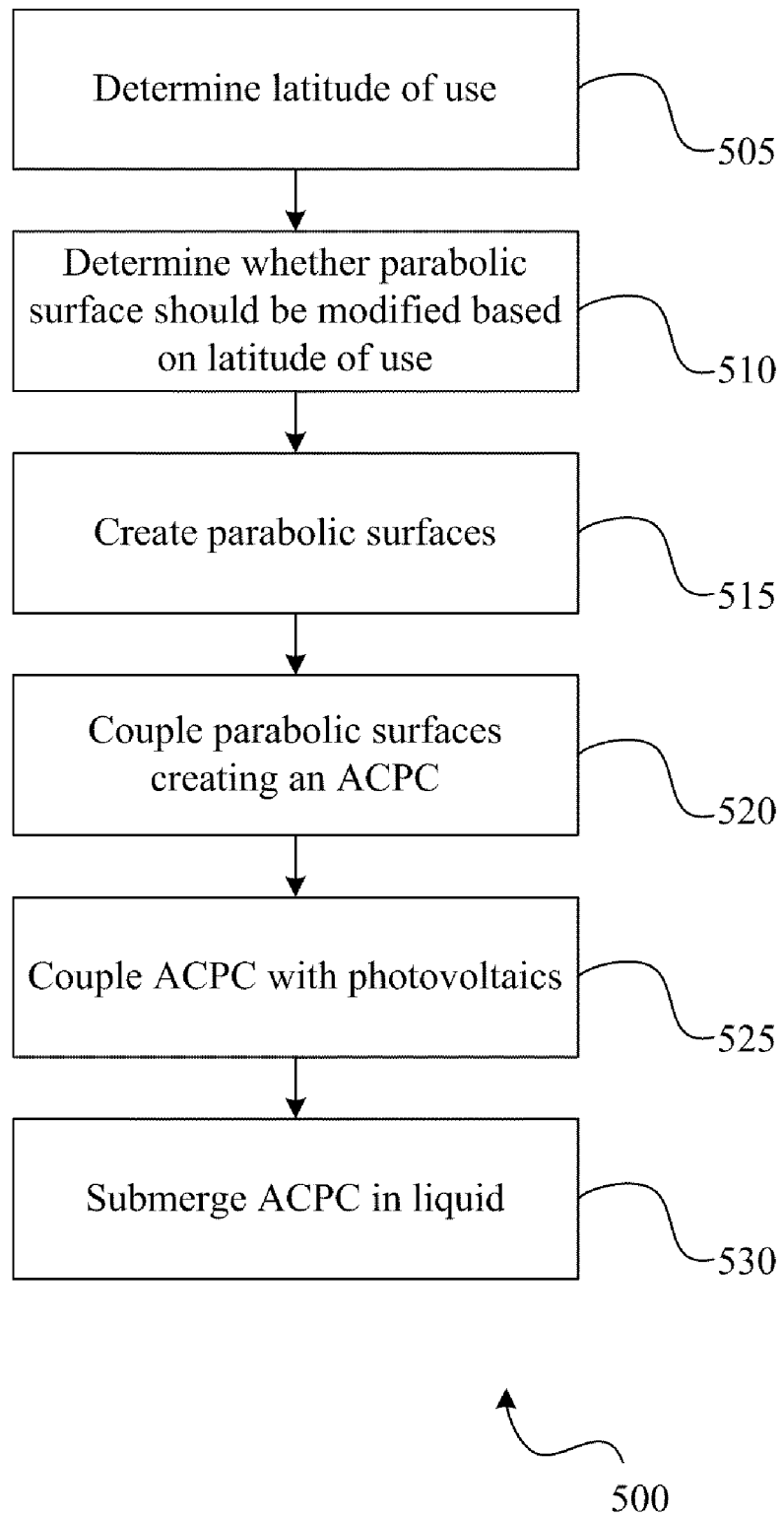
FIG. 5 shows a flowchart for developing an asymmetric compound parabolic concentrator according to some embodiments of the invention.

FIG. 5 is a flowchart of a process 500 for creating an ACPC photovoltaic system according to some embodiments. At block 505, process 500 can determine the latitude of use for the ACPC-PV system. At block 510 process 500 can determine whether the parabolic surface should be modified based on the latitude of use. For example, if the ACPC-PV system is used in northern latitudes, then the parabolic surfaces can be modified to accept light at lower angles of incidence. In some embodiments, although the ACPC-PV system will be used in high latitudes modifications may not be necessary because the system may still allow a sufficient amount of light to be incident on the photovoltaic cells.

At block 515 the parabolic surfaces can be created either with the standard design or with a modified design. In some embodiments, the parabolic surfaces can be created by bending sheets of reflective material or other material such as acrylic, into the parabolic shapes. In some embodiments, parabolic surfaces can be created using a mold. For example, liquid acrylic resin can be poured into a mold to create the parabolic shapes such as the shape shown in FIG. 4. In some embodiments, the parabolic shapes can be extruded. Various other techniques can be used for creating parabolic surfaces.

At block 520, the parabolic surface(s) can be aligned to create an ACPC. The surfaces can be aligned in parallel as shown in FIG. 4. At block 525, the ACPC can be coupled with a photovoltaic cell at the exit aperture of the ACPC. The photovoltaic cell can be coupled in such away that the photovoltaic cell is sealed from any liquid such as water damaging the photovoltaic cell from which the ACPC is submerged. For example, a transparent material (e.g., a sheet of acrylic or the like) can be coupled between the two parabolic surfaces at the exit aperture. The transparent material can also seal the ends of the ACPC between the two parabolic surfaces. The transparent material can be sealed with the parabolic surfaces creating a trough like shape. When sealed, the troughs can be filled with water and not leak and damage the photovoltaic cells. As another example, the photovoltaic cell can be sealed within a chamber and submerged within the liquid. The chamber can still permit light from the ACPC to enter the chamber and activate the photovoltaic cell, but the liquid within which the chamber is submerged can protect the photovoltaic cell from damage.

At block 530 ACPC can be submerged within a liquid such as water. The ACPC-PV can the be used to generate electricity from solar energy. While process 500 has been shown in conjunction with the blocks shown in FIG. 5, various other blocks, steps, sub-processes, etc. can be used in conjunction and/or in between blocks. Moreover, blocks can be performed in any order and blocks can be removed from process 500.

FIG. 6 is a side view of block 430 that includes two different parabolic surfaces according to some embodiments of the invention. Block 430 includes two different parabolic surfaces and can be positioned as part of two different ACPC as shown in FIG. 4. FIG. 6 shows an example of dimensions in millimeters and angles in degrees for reflective surfaces in an ACPC. As shown, the reflective surfaces include linear portions near the exit aperture.

Figure 8:
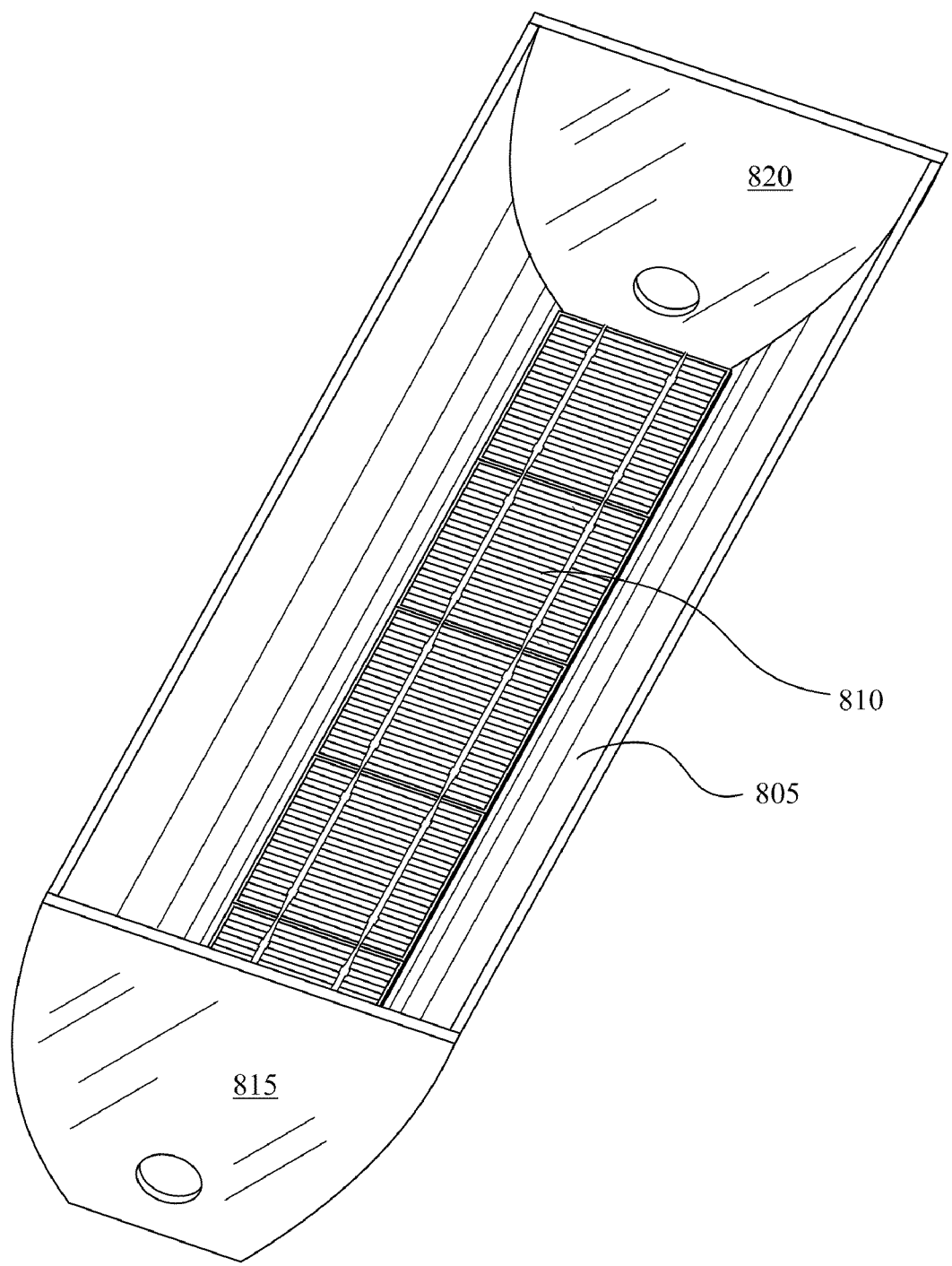
FIG. 8 shows an assembled ACPC-PV according to one embodiment of the invention.

FIG. 8 shows an assembled ACPC-PV 800 according to one embodiment of the invention. In the ACPC-PV shown, six photovoltaic cells 810 are disposed within the exit aperture of the ACPC 805. ACPC 805 can also include reflective ends 815, 820. Reflective ends 815, 820 can be made out of any material (e.g., aluminum) and can direct light that could potentially exit ACPC 805 through the ends back into ACPC 805. While six photovoltaic cells 810 are shown, any number of cells can be used. Moreover, while embodiments described herein discuss photovoltaic cells in an ACPC-PV in series, in some embodiments, such photovoltaic cells could also be electrically coupled in parallel.

Figure 9:
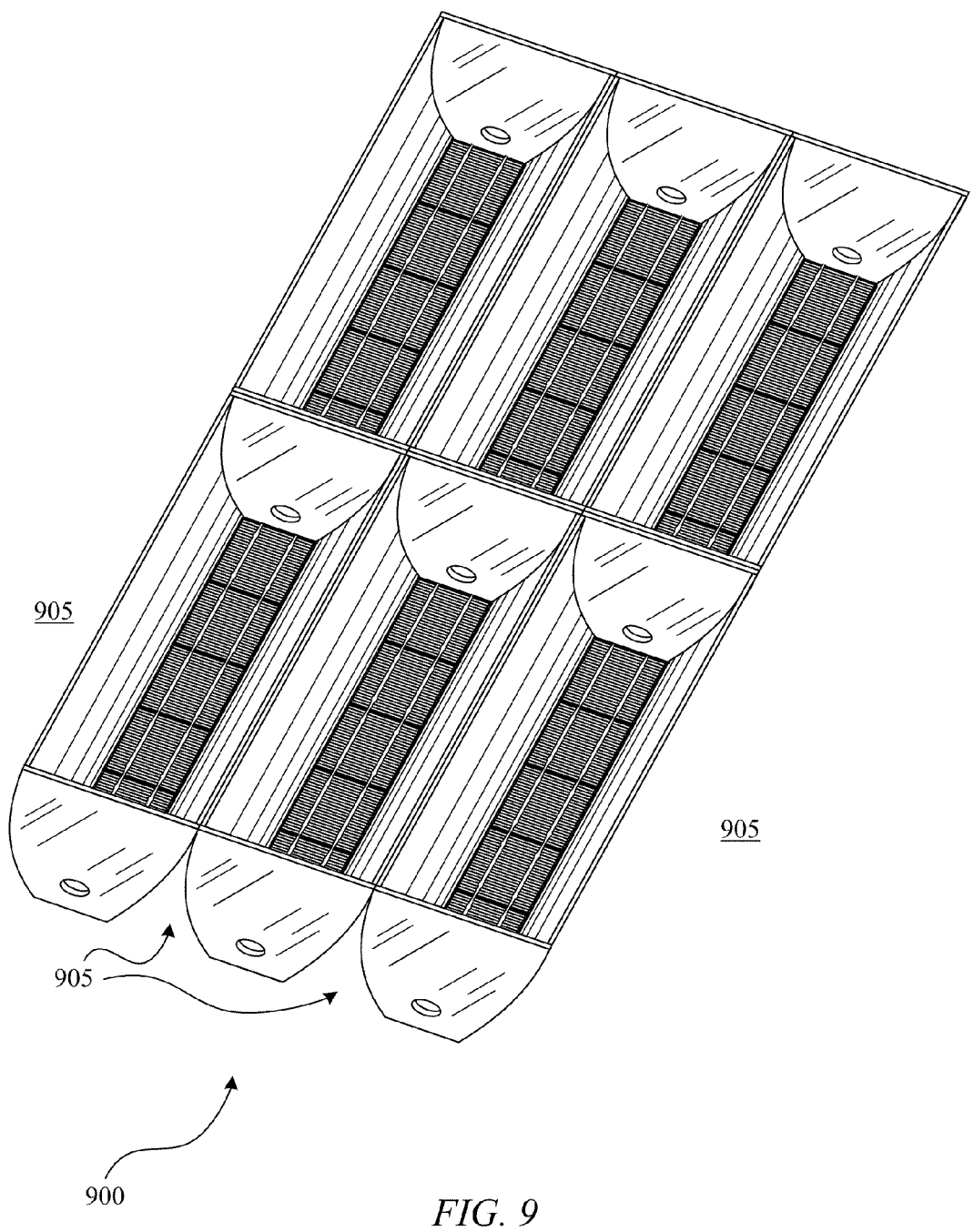
FIG. 9 shows six ACPC-PVs coupled in series and in parallel according to one embodiment of the invention.

FIG. 9 shows a solar array 900 that includes six ACPC-PVs coupled in series and in parallel according to one embodiment of the invention. While six ACPC-PVs are shown, any number of ACPC-PVs can be used without limitation. The figure shows three rows of ACPC-PVs that include two ACPC-PVs in each row. In some embodiments, the ACPC-PVs in a row can be electrically coupled in series and each row of ACPC-PVs can be coupled in parallel. Moreover, any combination of parallel and series coupling can be used. In some embodiments, regions 905 can be an ambient environment (e.g., air) while the troughs defined by the ACPCs can be filled with a fluid with a high index of refraction (e.g., water). In some embodiments, the regions between ACPCs can utilize a structure similar to that shown in FIG. 7A or 7B.

What is claimed is:

1. A solar cell comprising:
    an asymmetric compound parabolic concentrator including an entrance and an exit aperture, wherein the asymmetric compound parabolic concentrator includes two reflective surfaces with distinct parabolic shapes, and wherein the two reflective surfaces comprise a linear portion near the exit aperture, and a parabolic portion near the entrance aperture;
    a photovoltaic cell positioned near the exit aperture of the asymmetric compound parabolic concentrator such that a majority of the light incident at the asymmetric compound parabolic concentrator is directed toward the active surface of the photovoltaic cell; and
    a liquid, wherein the asymmetric compound parabolic concentrator is submerged within the liquid.

2. The solar cell according to claim 1, wherein the full acceptance angle is at least 45°.

3. The solar cell according to claim 1, wherein the effective full acceptance angle is at least 60°.

4. The solar cell according to claim 1, wherein the asymmetric compound parabolic concentrator comprises acrylic.

5. The solar cell according to claim 1, wherein the liquid comprises water.

6. The solar cell according to claim 1, wherein the photovoltaic cell comprises an off the shelf photovoltaic cell.

7. The solar cell according to claim 1, wherein the photovoltaic cell comprises a plurality of photovoltaic cells.

8. The solar cell according to claim 7, wherein the plurality of photovoltaic cells are aligned in a row and electrically coupled in series.

9. The solar cell according to claim 1, wherein the photovoltaic cell includes at least one tab wire that is aligned substantially parallel with a trough axis of the asymmetric compound parabolic concentrator.

10. The solar cell according to claim 1, wherein the photovoltaic cell is hermetically sealed.

11. A method comprising:
    creating a first acrylic parabolic surface;
    creating a second acrylic parabolic surface with a shape distinct from the shape of the first parabolic surface, and wherein both the first and second acrylic parabolic surfaces include a linear portion and a parabolic portion;
    coupling the first acrylic parabolic surface with the second acrylic parabolic surface to create an acrylic concentrator with an entrance aperture and exit aperture;
    coupling the acrylic concentrator with a photovoltaic cell such that the photovoltaic cell is disposed near the exit aperture of the concentrator; and
    submerging the first acrylic parabolic surface and the second acrylic parabolic surface within a fluid.

12. The method according to claim 11, wherein the liquid comprises water.

13. The method according to claim 11, wherein the photovoltaic cell comprises a plurality of photovoltaic cells.

14. The method according to claim 11, further comprising aligning the photovoltaic cell such that the tab wires are aligned in parallel with an axis of the acrylic concentrator.

15. A solar array comprising:
    a first plurality of photovoltaic asymmetric compound parabolic concentrators, wherein each of the first plurality of photovoltaic asymmetric compound parabolic concentrators comprises at least one photovoltaic cell and an asymmetric compound parabolic concentrator positioned to concentrate light toward the photovoltaic cell, and wherein each of the first plurality of photovoltaic asymmetric compound parabolic concentrators are electrically coupled in series; and
    a second plurality of photovoltaic asymmetric compound parabolic concentrators, wherein each of the second plurality of photovoltaic asymmetric compound parabolic concentrators comprises at least one photovoltaic cell and an asymmetric compound parabolic concentrator positioned to concentrate light toward the photovoltaic cell, wherein each of the second plurality of photovoltaic asymmetric compound parabolic concentrators are electrically coupled in series,
    a liquid within which the first plurality of photovoltaic asymmetric compound parabolic concentrators and the second plurality of photovoltaic asymmetric compound parabolic concentrators are submerged within the liquid;
    wherein the first plurality of photovoltaic asymmetric compound parabolic concentrators are electrically coupled with the second plurality of photovoltaic asymmetric compound parabolic concentrators in parallel or series,
    wherein the compound parabolic concentrators each include an entrance aperture and an exit aperture with the associated photovoltaic cell being disposed near the exit aperture of the respective concentrator, and
    wherein the compound parabolic concentrators include at least two reflective surfaces with distinct parabolic shapes, wherein the two reflective surfaces comprise a linear portion near the exit aperture, and a parabolic portion near the entrance aperture.

16. The solar array according to claim 15, wherein each of the asymmetric compound parabolic concentrators comprise acrylic.

17. The solar array according to claim 15, wherein each of the photovoltaic asymmetric compound parabolic concentrator include at least one tab line that is arranged parallel with an axis of the asymmetric compound parabolic concentrator.

* * * * *